(12) United States Patent
Liu et al.

(10) Patent No.: US 9,142,614 B2
(45) Date of Patent: Sep. 22, 2015

(54) ISOLATION TRENCH THROUGH BACKSIDE OF SUBSTRATE

(71) Applicant: Taiwan Semiconductor Manufacturing Company Limited, Hsin-Chu (TW)

(72) Inventors: Ming Chyi Liu, Hsinchu (TW); Sheng-de Liu, Zhongli (TW); Chi-Ming Chen, Zhubei (TW); Che-Ming Chang, Longtan Township (TW); Chung-Yen Chou, Hsinchu (TW); Chia-Shiung Tsa, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/935,810

(22) Filed: Jul. 5, 2013

(65) Prior Publication Data

US 2015/0008556 A1 Jan. 8, 2015

(51) Int. Cl.
*H01L 29/06* (2006.01)
*H01L 21/762* (2006.01)
(52) U.S. Cl.
CPC ...... *H01L 29/0649* (2013.01); *H01L 21/76224* (2013.01)

(58) Field of Classification Search
CPC combination set(s) only.
See application file for complete search history.

(56) References Cited

U.S. PATENT DOCUMENTS 6,979,797 B2 * 12/2005 Rivas et al. ............... 219/121.69
2012/0199984 A1 * 8/2012 Fujita et al. .................... 257/774

* cited by examiner

*Primary Examiner* — Mamadou Diallo
(74) *Attorney, Agent, or Firm* — Cooper Legal Group, LLC

(57) ABSTRACT

Among other things, one or more semiconductor arrangements comprising isolation trenches, and techniques for forming such isolation trenches are provided. A substrate comprises a front side surface and a backside surface. One or more devices are formed over the front side surface. A wet etch is performed to form a tapered portion of an isolation trench. A dry etch is performed to form a non-tapered portion of the isolation trench. Because both the wet etch and the dry etch are performed, etching time is reduced compared to merely using the dry etch due to the wet etch having a relatively faster etch rate than the dry etch. In an embodiment, the isolation trench provides isolation for a current leakage path associated with a device or other material formed over the front side surface. In an embodiment, metal is formed within the isolation trench for backside metallization.

20 Claims, 9 Drawing Sheets

US 9,142,614 B2

ISOLATION TRENCH THROUGH BACKSIDE OF SUBSTRATE

BACKGROUND

A semiconductor wafer comprises a substrate upon which one or more devices, such as transistors, or other material are formed.

DETAILED DESCRIPTION

Figure 1:
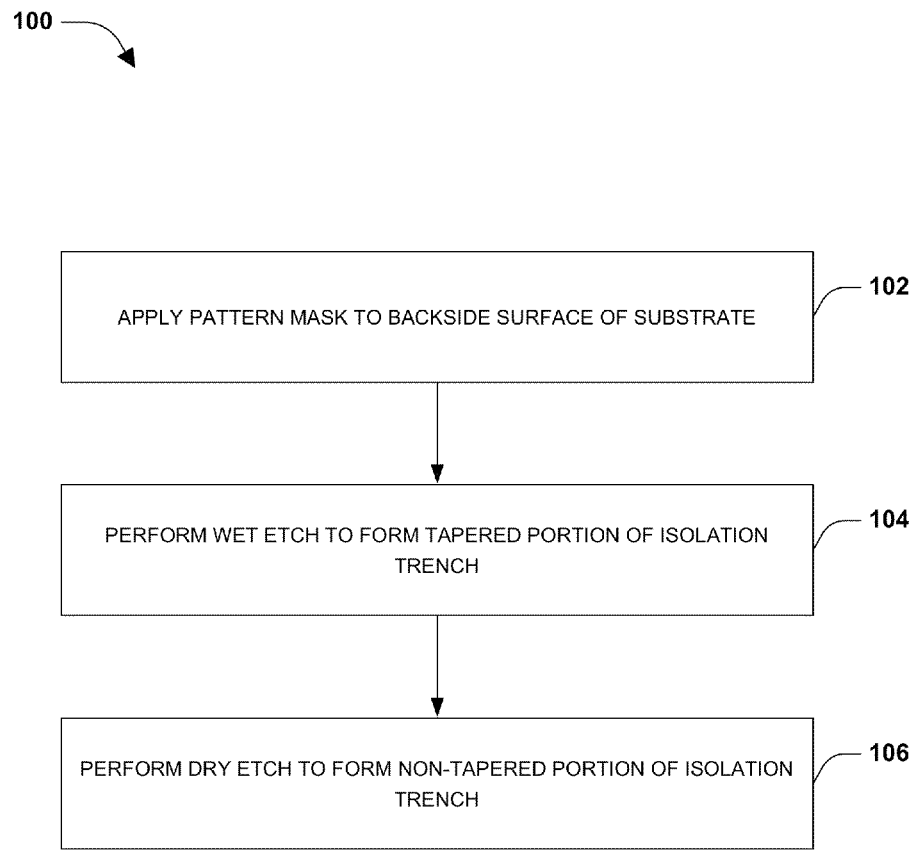
FIG. 1 is a flow diagram illustrating a method of forming an isolation trench through a backside surface of a substrate, according to some embodiments.
Figure 2:
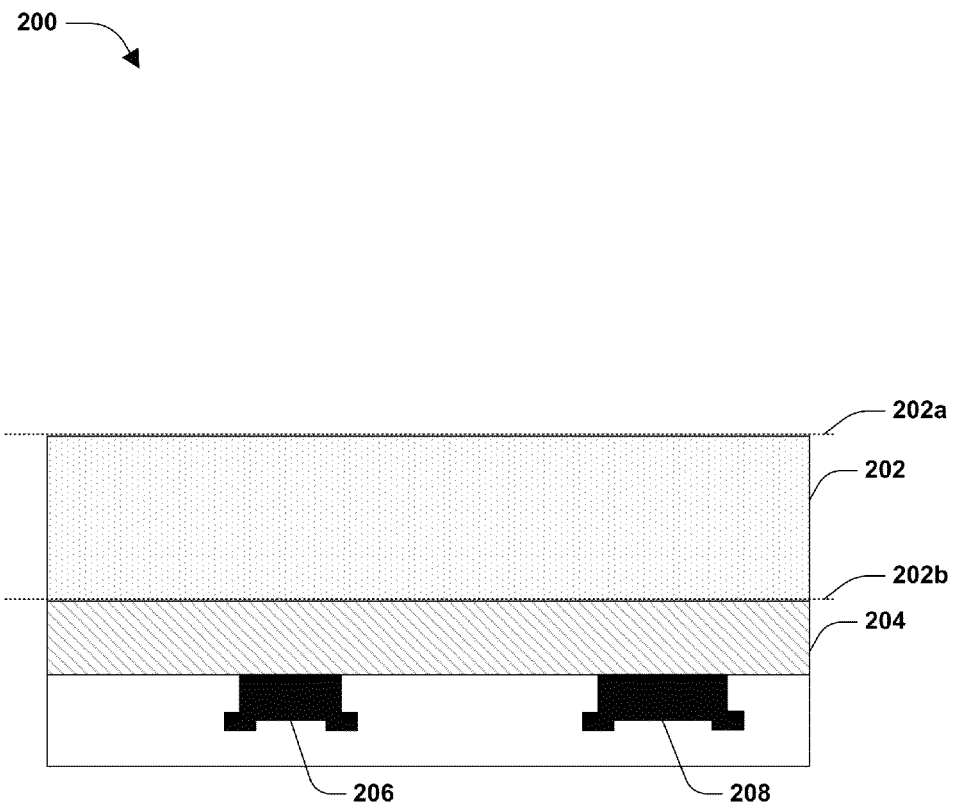
FIG. 2 is an illustration of a substrate comprising a front side surface and a backside surface, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

A backside surface of a substrate, such as comprising or comprised within a semiconductor wafer, is etched for various purposes. In an embodiment, the backside surface is etched to isolate a current leakage path through the substrate. In an embodiment, the backside surface is etched to expose or provide access to a material, such as sacrificial oxide or polysilicon, for subsequent processing. In an embodiment, the backside surface is etched to perform metallization, which improves thermal or electrical properties of devices formed upon the substrate. The etching is generally constrained to certain depths or widths, otherwise the structural integrity of the wafer is compromised and an additional wafer is needed to provide support. As provided herein, at least some of the etching of the backside of the substrate is performed using a wet etching technique, which is generally faster than dry etching techniques, to increase the rate at which the backside of the wafer is etched, thus enhancing throughput.

One or more semiconductor arrangements comprising an isolation trench and one or more techniques for forming such isolation trenches through backside surfaces of substrates are provided herein. In an embodiment, a substrate comprises a front side surface and a backside surface. One or more devices, such as transistors or other material, are formed over the front side surface. An isolation trench is formed through the backside surface of the substrate. In an embodiment, a wet etch is performed to form a tapered portion of the isolation trench. After the wet etch is performed, a dry etch is performed to form a non-tapered portion of the isolation trench. In this way, the isolation trench comprises a tapered portion, formed between the backside surface of the substrate and the non-tapered portion, and comprises the non-tapered portion formed between the front side surface of the substrate and the tapered portion. In an embodiment, the isolation trench is used to isolate a current leakage path through the substrate (e.g., the isolation trench is filled with a dielectric material). In an embodiment, at least a portion of the isolation trench is filled with metal for various purposes, such as heat dissipation, mitigation of electrical disturbances, or other purposes. In an embodiment, the isolation trench provides access to oxide, polysilicon, or other materials formed over the front side surface of the substrate for subsequent processing (e.g., removal of sacrificial oxide or polysilicon). Because the wet etch takes substantially less time than the dry etch (e.g., the wet etch has a wet etch rate of about 10-100 um/min, whereas the dry etch has a dry etch rate of about 6-7 um/min), overall or cumulative etching time for forming the isolation trench is substantially reduced. Reduction of etching time improves semiconductor wafer processing, such as an improvement to a wafers per hour (WPH) metric where more semiconductor wafers are processed within a time period. Performing both the wet etch and the dry etch results in an improve profile, corresponding to the tapered portion or the non-tapered portion of the isolation trench, for subsequent processing, such as a sputter gap fill process for backside metal deposition.

A method 100 of forming an isolation trench through a backside surface of a substrate is illustrated in FIG. 1, and one or more semiconductor arrangements formed by such a methodology are illustrated in FIGS. 2-9. A semiconductor arrangement comprises a substrate 202 having formed thereon a semiconductor device, an integrated circuit, or one or more layers or regions of material, alone or in combination, as illustrated in embodiment 200 of FIG. 2. The substrate 202 comprises a front side surface 202b and a backside surface 202a. One or more devices are formed over the front side surface 202b. In an embodiment, an Epi layer 204 is formed over the front side surface 202b. A first device 206 and a second device 208 are formed over the Epi layer 204. The semiconductor arrangement of embodiment 200 is illustrated such that the backside surface 202a is exposed for backside etching. In an embodiment, the substrate 202 comprises silicon, indium phosphide, sapphire, or other substrate material. In an embodiment, the substrate 202 comprises a thickness of about 375 um or less, such as between about 250 um to about 300 um.

Figure 3:
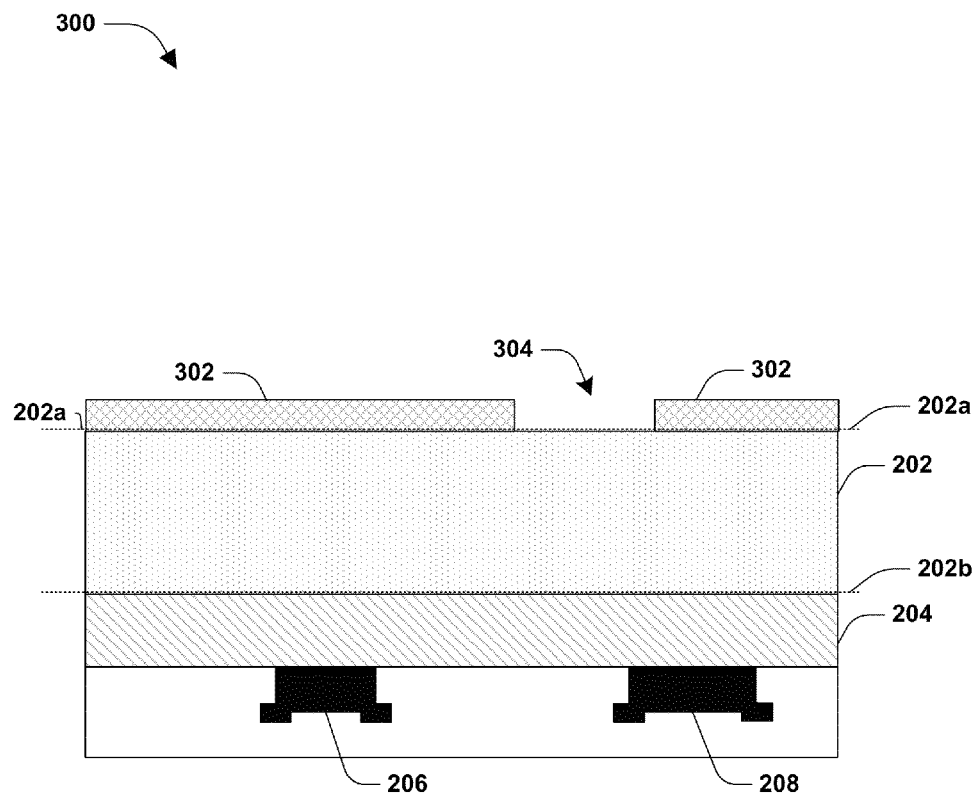
FIG. 3 is an illustration of a pattern mask, according to some embodiments.

At 102, a pattern mask 302 is applied to the backside surface 202a of the substrate 202, as illustrated in embodiment 300 of FIG. 3. In an embodiment, the pattern mask 302 comprises a photoresist or other material used to protect portions of the substrate 202 that are to remain after etching. The pattern mask 302 comprises or defines an opening 304 through which an etching process removes a portion of the substrate 202.

Figure 4:
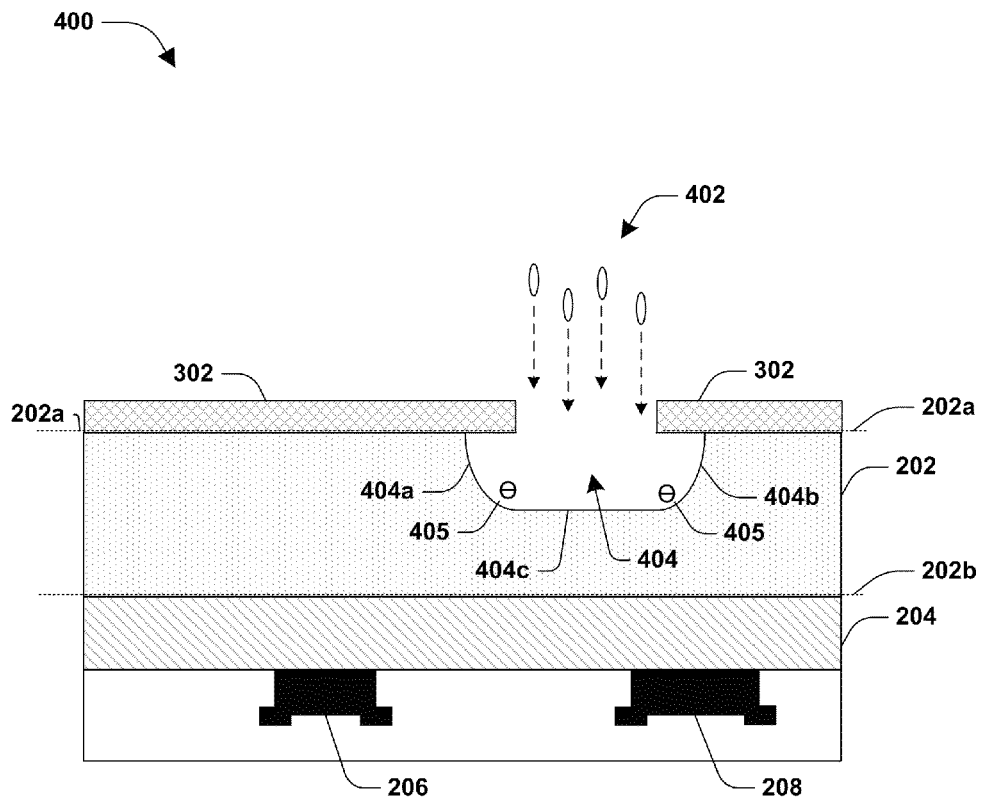
FIG. 4 is an illustration of a wet etch, according to some embodiments.

At 104, a wet etch 402 is performed to from a tapered portion 404 of an isolation trench 602 within the substrate 202, as illustrated in embodiment 400 of FIG. 4. The tapered portion 404 comprises or is defined by a first tapered sidewall surface 404a and a second tapered sidewall surface 404b. In an embodiment, the first tapered sidewall surface 404a and the second tapered sidewall surface 404b are formed according to a curved profile. In an embodiment, the wet etch 402 results in an angle ⊖ 405 of between about 80° to about 140° between a bottom surface 404c of or defining the tapered portion 404 and at least one of the first tapered sidewall surface 404a or the second tapered sidewall surface 404b. In an embodiment, at least one of the first tapered sidewall surface 404a or the second tapered sidewall surface have a slope of between about 0.5 to about 5. In an embodiment, the wet etch 402 comprises an acid base corresponding to a hydrofluoric nitric acetic (HNA) mixture (e.g., HF/NHO$_3$/ acetic acid or water), a hydrofluoric acid-hydrogen peroxide mixture (FPM) mixture (e.g., HF/H$_2$O$_2$), or an FOM mixture (e.g., HF/O$_3$). In an embodiment, the wet etch 402 comprises an alkali base corresponding to ammonium hydroxide, tetramethylammonium hydroxide, or tetraethylammonium hydroxide. The wet etch 402 has a relatively faster etch rate than a dry etch (e.g., a wet etch rate of about 10-100 um/min compared to a dry etch rate of about 6-7 um/min), and thus the wet etch 402 is used to improve an etch time for the substrate 202, and thus improve a number or amount of semiconductor wafers that are processed in a time period. In an embodiment, the wet etch 402 is performed in a first processing chamber.

Figure 5:
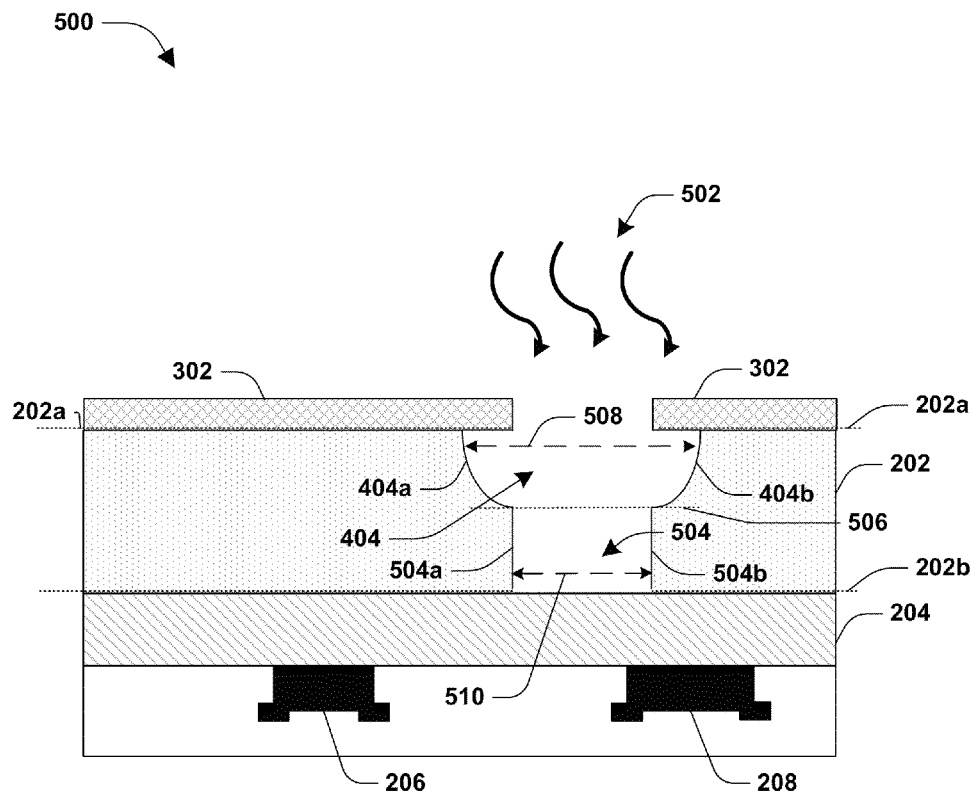
FIG. 5 is an illustration of a dry etch, according to some embodiments.

At 106, a dry etch 502 is performed to form a non-tapered portion 504 of the isolation trench 602 within the substrate 202, as illustrated in embodiment 500 of FIG. 5. The non-tapered portion 504 comprises a first non-tapered sidewall surface 504a and a second non-tapered sidewall surface 504b. In an embodiment, the first non-tapered sidewall surface 504a and the second non-tapered sidewall surface 504b are formed according to substantially vertical profile, such as to be substantially perpendicular to at least one of the backside surface 202a or the front side surface 202b of the substrate 202. In an embodiment, the tapered portion 404 has a tapered width 508 that is greater than a non-tapered width 510 (e.g., about 30 um) of the non-tapered portion 504. In an embodiment, the non-tapered portion 504 is formed below the tapered portion 404 or closer to the front side surface 202b of the substrate 202, as illustrated by a line 506 drawn between the tapered portion 404 and the non-tapered portion 504 for illustrative purposes. In this way, the tapered portion 404 is formed between the backside surface 202a of the substrate 202 and the non-tapered portion 504, and the non-tapered portion 504 is formed between the tapered portion 404 and the front side surface 202b of the substrate 202. In an embodiment, the dry etch 502 is performed after the wet etch 402. In an embodiment, the dry etch 502 is performed in a second processing chamber different than the first processing chamber (e.g., chemicals or byproducts from the wet etch 402 are substantially not present during the dry etch 502). In an embodiment, the dry etch 502 comprises a Bosch etching technique. Bosch etching technique comprises a first operation corresponding to a C$_4$F$_8$ mixed with oxygen and a second operation corresponding to SF$_6$. In an embodiment, the pattern mask 302 is removed, as illustrated in embodiment 600 of FIG. 6.

Figure 6:
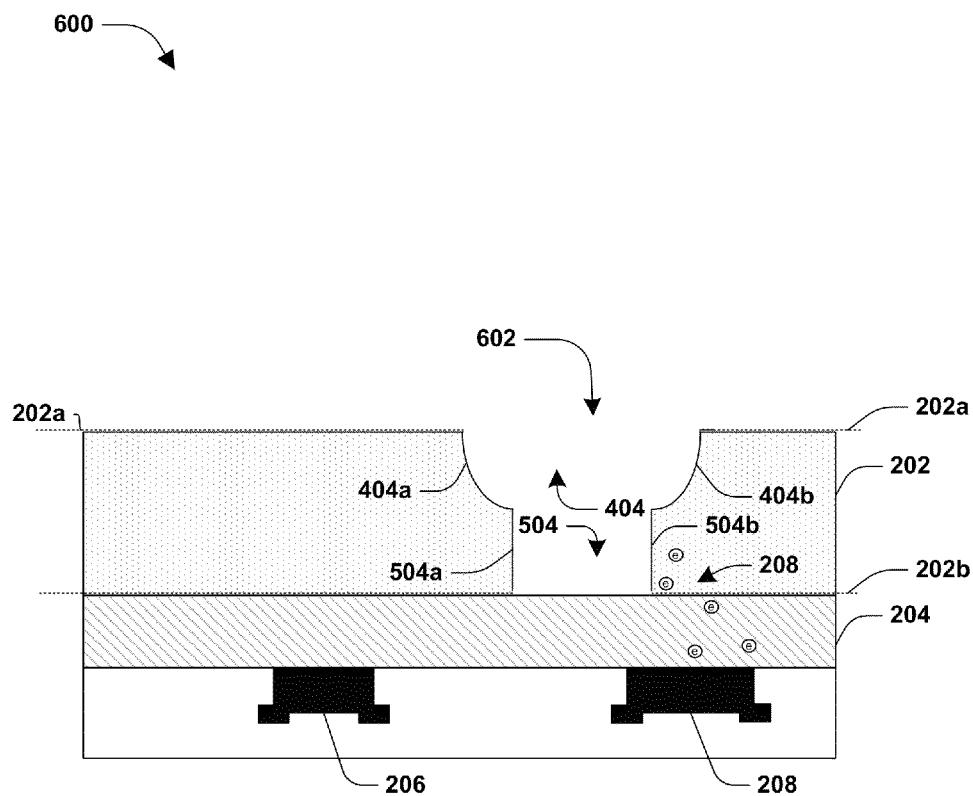
FIG. 6 is an illustration of an isolation trench, according to some embodiments.
Figure 7:
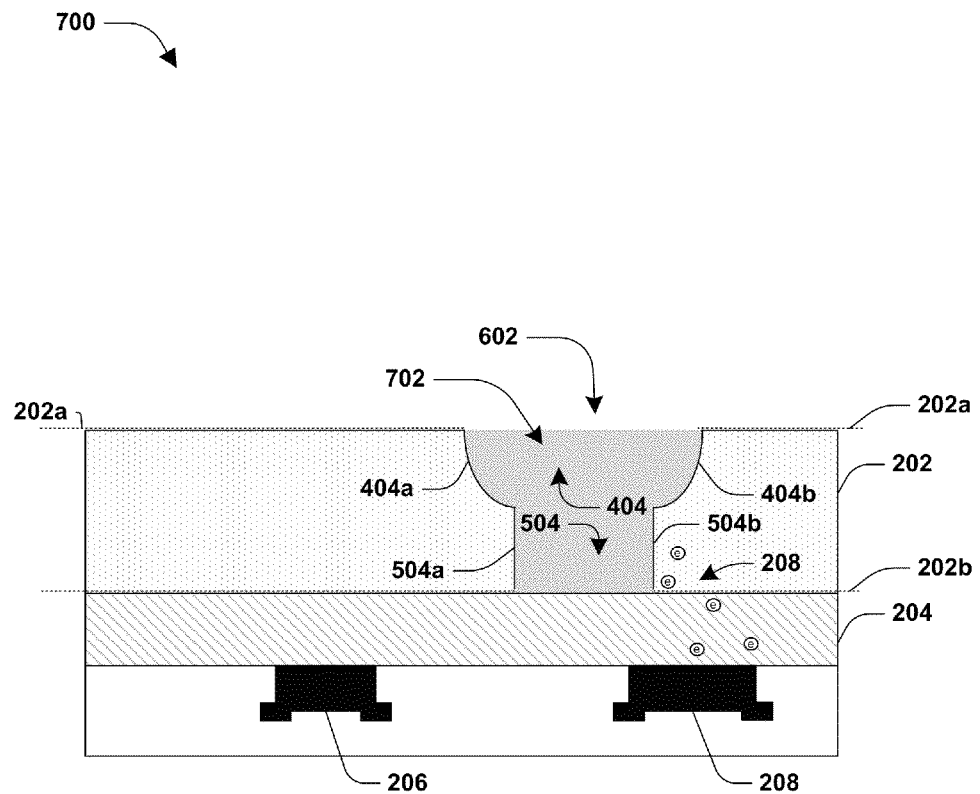
FIG. 7 is an illustration of an isolation trench filled with dielectric material, according to some embodiments.

In this way, the isolation trench 602 is formed within the substrate 202 through the backside surface 202a of the substrate 202, as illustrated in embodiment 600 of FIG. 6. Because both the wet etch 402 and the dry etch 502 are performed to form the isolation trench 602, etching time is reduced as compared to where merely the dry etch 502 is performed. Etching time is reduced because the wet etch 402 has a relatively faster etch rate than the dry etch 502. At least one of the tapered or non-tapered profile of the isolation trench 602 provide an improved profile for subsequent processing, such as for sputter gap fill for backside metal deposition. In an embodiment, the isolation trench 602 is filled with an ambient material, such as air. In an embodiment, the isolation trench 602 is filled with a dielectric material 702, as illustrated in embodiment 700 of FIG. 7. The ambient material or the dielectric material 702 provides electrical isolation that mitigates leakage current 208 from occurring between one or more devices or other material (e.g., material having a relatively lower band gap than the substrate 202) formed over the front side surface 202b of the substrate 202, such as between the first device 206 and the second device 208, as illustrated in embodiment 600 of FIG. 6 and embodiment 700 of FIG. 7.

Figure 8:
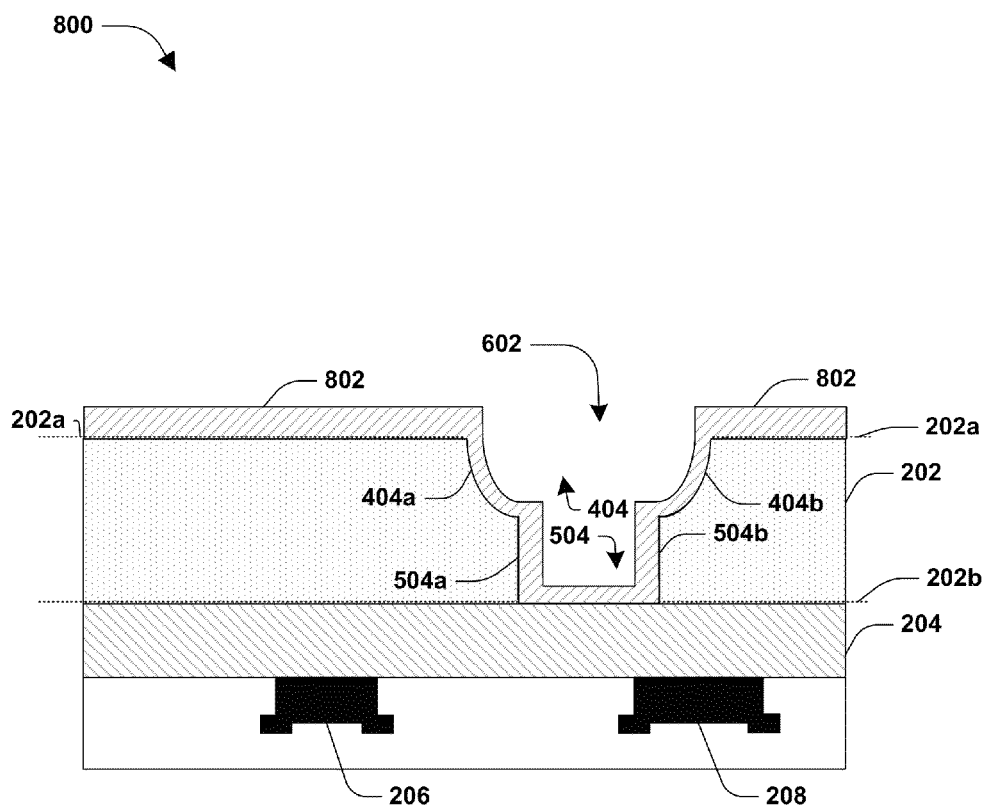
FIG. 8 is an illustration of an isolation trench at least partially filled with metal, according to some embodiments.

In an embodiment, at least some of the isolation trench 602 is filled with metal, such as a metal layer 802, as illustrated in embodiment 800 of FIG. 8. Backside metallization of the backside surface 202a improves heat dissipation, mitigate electrical disturbances, reduce electric resistance and inductance, reduce thermal resistance, or provide one or more other electrical or thermal benefits.

Figure 9:
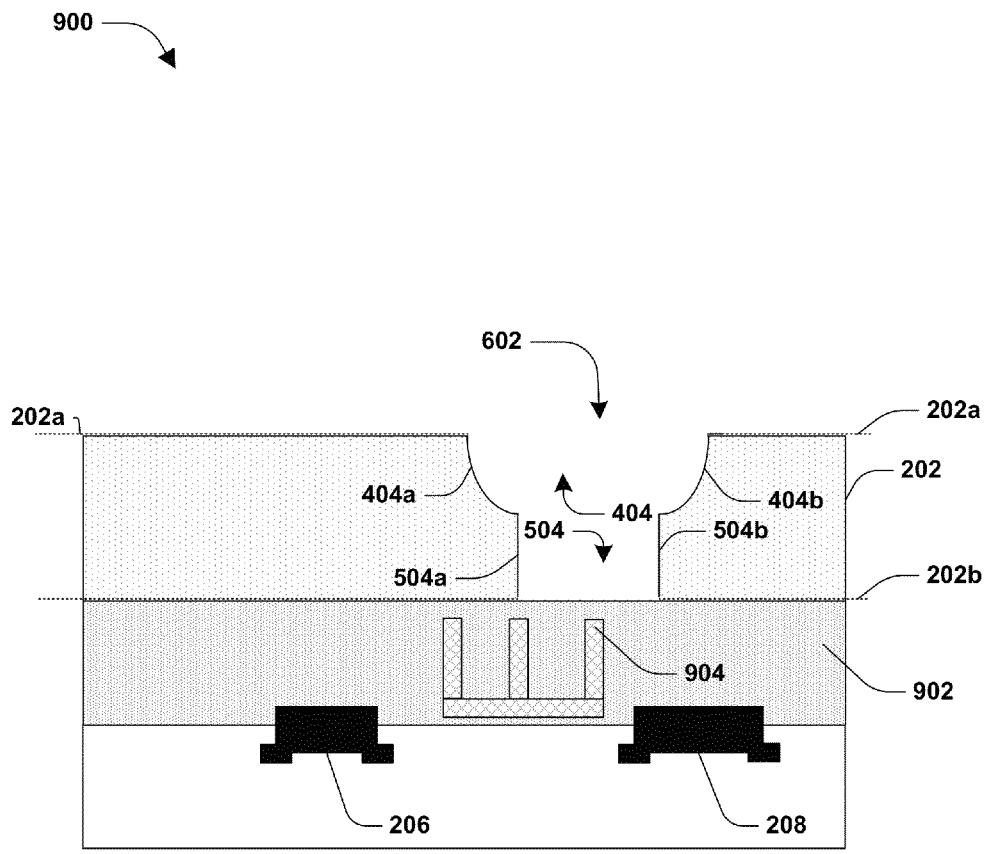
FIG. 9 is an illustration of an isolation trench, according to some embodiments.

In an embodiment, the isolation trench 602 is formed to a depth corresponding to one or more devices formed over the front side surface 202b of the substrate 202, as illustrated in embodiment 900 of FIG. 9. In an embodiment, access to oxide 902, polysilicon 904, or other materials is provided through the isolation trench 602. In an embodiment, sacrificial oxide is accessible through the isolation trench 602 for removal during subsequent processing. In an embodiment, sacrificial polysilicon is accessible through the isolation trench 602 for removal during subsequent processing.

According to an aspect of the instant disclosure, a semiconductor arrangement is provided. The semiconductor arrangement comprises a substrate. The substrate comprises a front side surface and a backside surface. One or more devices are formed over the front side surface. An isolation trench is formed through the backside surface of the substrate. The isolation trench comprises a tapered portion and a non-tapered portion. The non-tapered portion has a non-tapered width that is less than a tapered width of the tapered portion. In an embodiment, the tapered portion is formed by a wet etch technique that is performed before a dry etch technique that is performed to form the non-tapered portion.

According to an aspect of the instant disclosure, a method for forming an isolation trench through a backside surface of a substrate is provided. The method comprises applying a pattern mask to a backside surface of a substrate. The substrate comprises a front side surface over which one or more devices are formed. A wet etch is performed to form a tapered portion of the isolation trench within the substrate. A dry etch is performed to form a non-tapered portion of the isolation trench. The non-tapered portion has a non-tapered width that is less than a tapered width of the tapered portion.

According to an aspect of the instant disclosure, a method for forming an isolation trench through a backside surface of a substrate is provided. The method comprises applying a pattern mask to a backside surface of a substrate. The substrate comprises a front side surface over which one or more devices are formed. A wet etch is performed to form a tapered portion of the isolation trench within the substrate. A dry etch is performed, after performance of the wet etch, to form a non-tapered portion of the isolation trench. The non-tapered portion is formed between the front side surface of the substrate and the tapered portion. The tapered portion is formed between the backside surface of the substrate and the non-tapered portion.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a substrate comprising a front side surface and a backside surface;
   one or more devices formed over the front side surface; and
   an isolation trench formed through the backside surface of the substrate, the isolation trench comprising a tapered portion and a non-tapered portion, the non-tapered portion having a non-tapered width that is less than a tapered width of the tapered portion, the tapered portion formed between the backside surface of the substrate and the non-tapered portion.

2. The semiconductor arrangement of claim 1, the non-tapered portion formed between the front side surface of the substrate and the tapered portion.

3. The semiconductor arrangement of claim 1, the non-tapered portion formed by a wet etch technique and the tapered portion formed by a dry etch technique.

4. The semiconductor arrangement of claim 3, the dry etch technique performed after the wet etch technique.

5. The semiconductor arrangement of claim 1, the tapered portion comprising a curved profile.

6. The semiconductor arrangement of claim 1, comprising a dielectric material disposed in the isolation trench.

7. The semiconductor arrangement of claim 1, comprising a metal disposed in the isolation trench.

8. The semiconductor arrangement of claim 1, the substrate comprising at least one of silicon, indium phosphide, or sapphire.

9. A semiconductor arrangement, comprising:
   a substrate comprising a front side surface and a backside surface;
   one or more devices formed over the front side surface; and
   an isolation trench formed through the backside surface of the substrate, the isolation trench comprising a tapered portion and a non-tapered portion, the non-tapered portion formed between the front side surface of the substrate and the tapered portion.

10. The semiconductor arrangement of claim 9, the non-tapered portion defined by a curved surface of the substrate.

11. The semiconductor arrangement of claim 9, comprising a metal layer disposed in the isolation trench.

12. The semiconductor arrangement of claim 9, comprising a conformal metal layer disposed in the isolation trench.

13. The semiconductor arrangement of claim 12, the conformal metal layer further disposed under the backside surface.

14. The semiconductor arrangement of claim 9, the non-tapered portion having a non-tapered width that is less than a tapered width of the tapered portion.

15. The semiconductor arrangement of claim 9, comprising a dielectric material disposed in the isolation trench.

16. The semiconductor arrangement of claim 9, the isolation trench extending from the backside surface to the front side surface.

17. A semiconductor arrangement, comprising:
   a substrate;
   one or more devices formed over a front side surface of the substrate; and
   an isolation trench extending through the substrate, the isolation trench comprising a tapered portion having a non-linear profile and a non-tapered portion having a linear profile, the tapered portion formed between a backside surface of the substrate and the non-tapered portion.

18. The semiconductor arrangement of claim 17, comprising a conformal metal layer disposed in the isolation trench.

19. The semiconductor arrangement of claim 17, comprising a dielectric material disposed in the isolation trench.

20. The semiconductor arrangement of claim 17, the isolation trench extending from the backside surface of the substrate to the front side surface of the substrate.

* * * * *